United States Patent [19]
Kawakami

[11] Patent Number: 5,332,982
[45] Date of Patent: Jul. 26, 1994

[54] LADDER-TYPE ELECTRIC FILTER DEVICE

[75] Inventor: Kenji Kawakami, Nagoya, Japan

[73] Assignee: NGK Spark Plug Co., Ltd., Japan

[21] Appl. No.: 910,729

[22] Filed: Jul. 8, 1992

[30] Foreign Application Priority Data

Jul. 10, 1991 [JP] Japan ................. 3-197033

[51] Int. Cl.$^5$ ............................................. H03H 9/00
[52] U.S. Cl. ...................................... 333/189; 333/190
[58] Field of Search ................ 333/187, 188, 189, 190, 333/191, 192; 310/348; 329/117

[56] References Cited

U.S. PATENT DOCUMENTS

| | | |
|---|---|---|
| 4,323,865 | 4/1962 | Tanaka et al. .................. 333/187 |
| 4,651,109 | 3/1987 | Inoue ............................. 333/189 |
| 4,716,377 | 12/1987 | Inoue ............................. 333/190 |
| 4,837,533 | 6/1989 | Oshikawa ....................... 333/190 |
| 4,841,264 | 6/1989 | Oshikawa ....................... 333/189 |
| 4,864,259 | 9/1989 | Takamoro et al. ............. 333/187 |
| 5,057,802 | 10/1991 | Ozeki et al. .................... 333/189 |
| 5,075,650 | 12/1991 | Okamura et al. .............. 333/185 |
| 5,130,680 | 7/1992 | Nagai et al. .................... 333/189 |
| 5,159,302 | 10/1992 | Tanaka ........................... 333/189 |

Primary Examiner—Raymond A. Nelli
Attorney, Agent, or Firm—Larson and Taylor

[57] ABSTRACT

A ladder-type electric filter comprising an input terminal, an output terminal, a plurality of series-resonators connected in series between said input terminal and said output terminal and a plurality of parallel-resonators each connected in parallel to the associated series-resonator, wherein each series-resonator has capacitance greater than that of the preceding series-resonator for improving a group delay time characteristic.

5 Claims, 6 Drawing Sheets

| SAMPLE | 1 | 2 | 3 | 4 |
|---|---|---|---|---|
| COMBI-NATION | $S_1$ 180, $S_2$ 180, $P_1$, $P_2$ | $S_1$ 110, $S_2$ 110, $P_1$, $P_2$ | $S_1$ 180, $S_2$ 110, $P_1$, $P_2$ | $S_1$ 110, $S_2$ 180, $P_1$, $P_2$ |
| GROUP DELAY TIME (±12KHz) | 10 μsec | 4 μsec | 10 μsec | 2 μsec |

FIG.5

| SAMPLE | 1 | 2 | 3 | 4 |
|---|---|---|---|---|
| COMBI-NATION | S1 180, S2 180, P1, P2 | S1 110, S2 110, P1, P2 | S1 180, S2 110, P1, P2 | S1 110, S2 180, P1, P2 |
| GROUP DELAY TIME (±12KHz) | 10 μsec | 4 μsec | 10 μsec | 2 μsec |

… 
LADDER-TYPE ELECTRIC FILTER DEVICE

BACKGROUND OF THE INVENTION

The present invent ion relates to a ladder-type electric filter device including a plurality of piezoelectric resonators arranged in series and parallel and suited for use with portable and mobile radio communication equipments.

A ladder-type electric filter device of the above described type normally comprises a plurality of L-connection circuits as basic unit circuits arranged in layers, each comprising a thick and small capacity series-resonator and a thin and large capacity parallel-resonator that are L connected and contained in a casing. Such an arrangement is disclosed in U.S. Pat. No. 4,864,259.

FIGS. 1 to 4 of the accompanying drawings illustrate a typical electric filter unit as disclosed in U.S. Pat. No. 5,057,802, its basic unit circuit comprising four resonators.

A shallow and substantially cuboidal casing 1 made of synthetic resin has an opening 2 at a front side portion and an inner space 3 for containing components of the filter device. The casing 1 is formed integrally with a grounding terminal plate 4 by insert molding, the terminal plate 4 having a connector leg 4a projecting outwardly and rearwardly from the rear wall portion of the casing 1.

The components of the filter circuits to be housed in the casing 1 are inserted into the inner space 3 of the casing 1 through the opening 2 and disposed above and below the grounging terminal plate 4. More specifically, a first buffer plate 5, an input terminal plate 6 provided at a front edge with a connector leg 6a, a first series-resonator 7, a first interconnecting terminal plate 8, a first auxilially terminal plate 9 and a parallel-resonator 10 are successively disposed above the grounding terminal plate 4 in this order from above.

Then, a second interconnecting terminal plate 11, an insulating plate 12, a third interconnecting terminal plate 13, a second series-resonator 14, an output terminal plate 15 provided at a front edge with a connector leg 15a, a second auxiliary terminal plate 16, a second parallel-resonator 17, a fourth interconnecting terminal plate 18 and a second buffer plate 19 are successively disposed below the grounding terminal plate 4.

The first and third interconnecting terminal plates 8 and 13 are connected with each other by a connecting strip 20 which is arranged at a front corner thereof and integrally formed. Similarly, the second interconnecting terminal plate 11 is connected to the fourth interconnecting terminal plate 18 by a connecting strip 21 which is arranged at a front corner thereof and integrally formed. The connecting strips 20 and 21 are positioned within lateral indentations 3a and 3b which are respectively provided on the lateral wall portions of the casing 1 near the opening 2 to partly define the inner space 3 and prevent the connecting strips 20 and 21 from contacting with any of the other components. When the filter components are housed in the casing 1, the connector leg 6a of the input terminal plate 6 and the connector leg 15a of the output terminal plate 15 project outwardly and forwardly from the respective opposite front corners. Then, sealing or cover plate 22 is fitted to the opening 2 of the casing 1 with the outwardly extending connector legs 6a and 15a running through respective through holes 22a and 22b, and the casing 1 is hermetically sealed by sealing agent or filler 23 such as epoxy resin applied to the sealing plate 22 to finish the operation of assembling a ladder-type electric filter unit.

As shown in FIG. 3, the filter unit having a configuration as described is then mounted on a print-circuit board 24 with the portions of the connector legs 6a, 15a and 4a folded in grooves 1a, 1b and 1c on the lower surface of the synthetic resin casing 1 being bonded to respective conductors of the print-circuit board 24 by means of soldering generally designated by the reference numeral 25.

The filter unit as described above essentially comprises a pair of basic filter unit circuits arranged in two layers, each including one series-resonator and one parallel-resonator which are L connected. Thus, a multi-layer filter circuit can be obtained by cascade connecting a plurality of such filter unit. FIG. 4 shows an equivalent circuit diagram of the ladder-type electric filter arrangement comprising tow filter units.

While ladder-type electric filter devices of the above described kind are popularly used for filter circuits of radio communication equipments of various types, they are required to show improved group delay characteristics along with excellent amplitude characteristics that they already have if they are used for digital modulation type mobile radio stations such as automobile and portable telephone sets.

The requirement for the improved group delay characteristics has been met, through not very satisfactorily, through improvement of the group delay characteristics of the ladder-type electric filters by using resonators of piezoelectric ceramic material having a small mechanical quality factor Qm. However, the resonators with such a small mechanical quality factor Qm are inevitably accompanied by a disadvantage of remarkably increased insertion loss as compared with resonators with a large mechanical quality factor Qm.

SUMMARY OF THE INVENTION

It is therefore an object of the present invention to provide a ladder-type electric filter device capable of overcoming the disadvantages in the prior art and having improved group delay characteristics.

According to the present invention, there is provided a ladder-type electric filter comprising an input terminal, an output terminal and a plurality of resonator units connected between the input terminal and the output terminal, each resonator unit including a series-resonator and a parallel-resonator which are L connected, the series-resonators of the resonator units connected in series between the input terminal and the output terminal having different capacitance values which are increased from the series-resonator in the resonator unit arranged closest to the input terminal to that in the resonator unit arranged closest to the output terminal.

It is preferable that the parallel-resonator in each resonator unit has a capacitance larger than that of the associated series-resonator.

In the preferred embodiment of the present invention, the ladder-type electric filter comprises two series-resonators connected in series between the input and output terminals and two parallel-resonators resonator units connected in parallel between the input and output terminals, and the series-resonator connected to the output terminal has a capacitance larger than that of the series-resonator connected to the input terminal.

The present invention will now be described by way of example with reference to the accompanying drawings:

BRIEF DESCRIPTION OF THE DRAWINGS

FIG. 5 is a schematic view showing different ladder-type electric filters including one according to the present invention and their characteristic figures, the filters being denoted respectively Samples 1 through 4;

DETAILED DESCRIPTION

Referring to FIG. 5 showing different ladder-type electric filters including one according to the present invention, each ladder-type electric filter comprises a pair of basic filter unit circuits, one having a series-resonator S1 and a parallel-resonator P1 which are L connected, and the other unit circuit having a series-resonator S2 and a parallel-resonator P2 which are L connected. Of these components, each of the parallel-resonators P1 and P2 has a capacitance of 780 pF while the series-resonators S1 and S2 have different capacitances depending on the samples.

With the ladder-type electric filter of Sample 1, each of the series-resonators S1 and S2 has a capacitance of 180 pF. Each of those of Sample 2 has a capacitance of 110 pF. In other words, Samples 1 and 2 are corresponding to conventional ladder-type electric filters.

The series-resonators S1 and S2 of Sample 3 respectively have capacitances of 180 pF and 110 pF, and this sample represents a filter prepared for purpose of comparison.

Finally, Sample 4 is an embodiment of the present invention in which the series-resonators S1 and S2 have capacitances of 110 pF and 180 pF, respectively.

Figure 1:
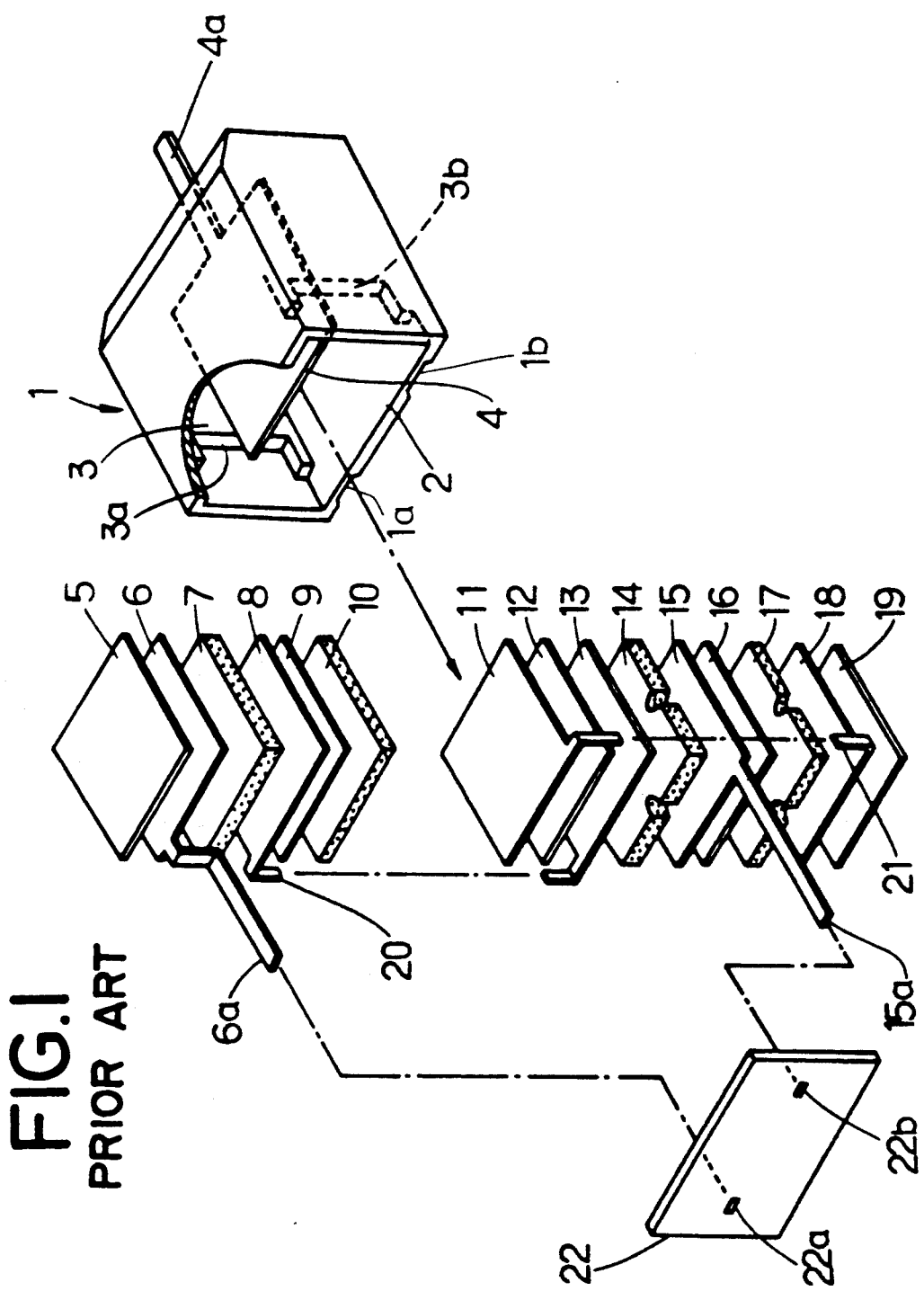
FIG. 1 is an exploded perspective view of a conventional ladder-type electric filter arrangement to which the present invention may be applied.
Figure 2:
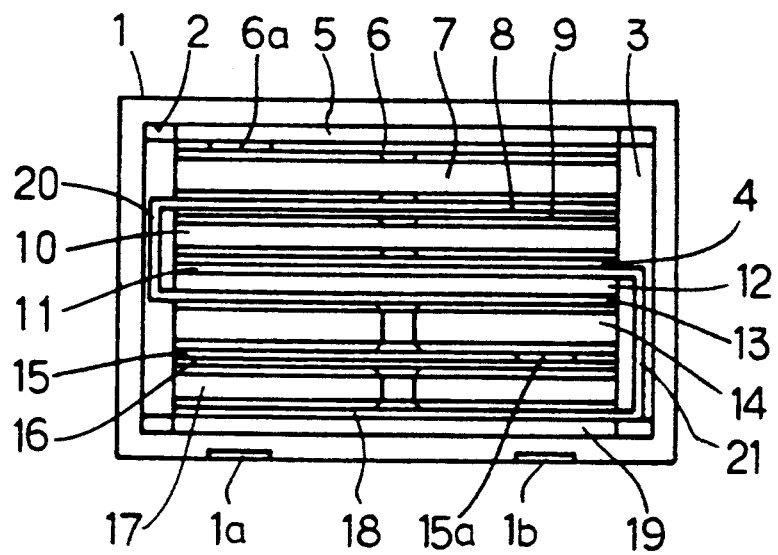
FIG. 2 is a schematic front view showing the electric filter arrangement of FIG. 1 when being mounted on a casing.
Figure 3:
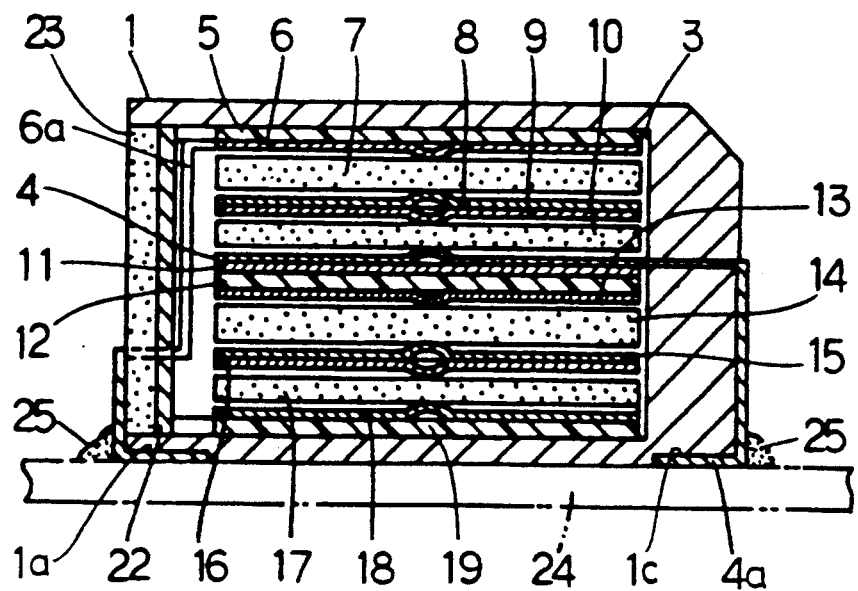
FIG. 3 is a schematic longitudinal section showing the assembled electric filter arrangement shown in FIG. 1.
Figure 4:
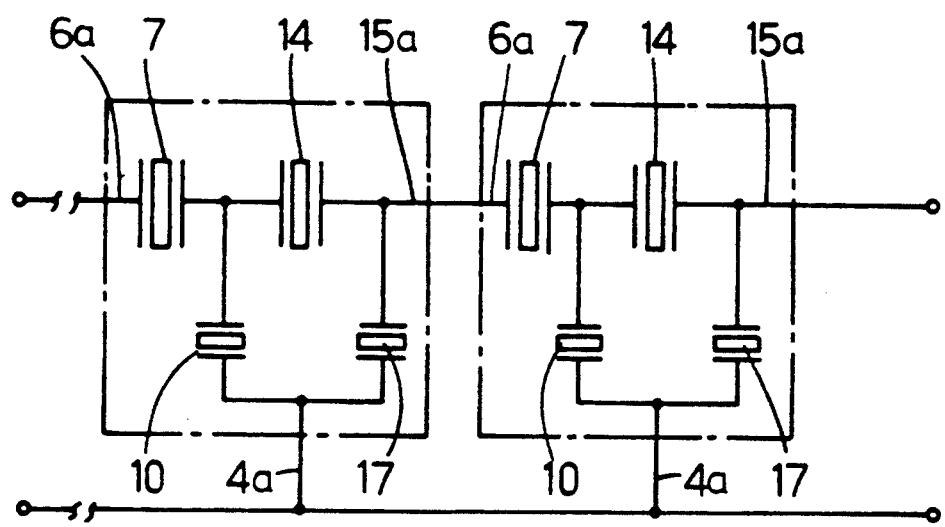
FIG. 4 is an equivalent circuit diagram of an electric filter device comprising two four-element type filter units.
Figure 6:
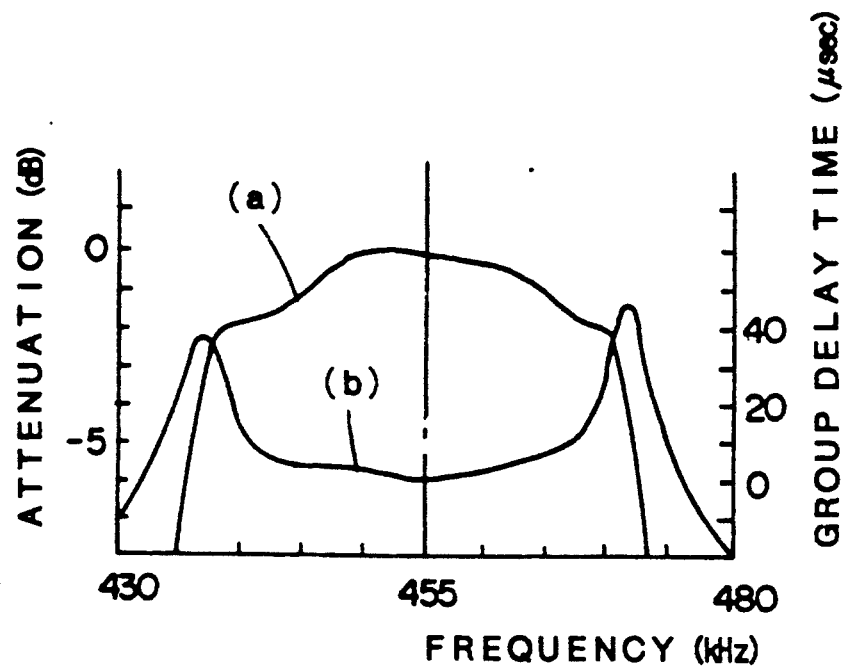
FIG. 6 is a graph showing an amplitude characteristic (a) and a group delay time characteristic (b) of Sample 1 in FIG. 5.
Figure 7:
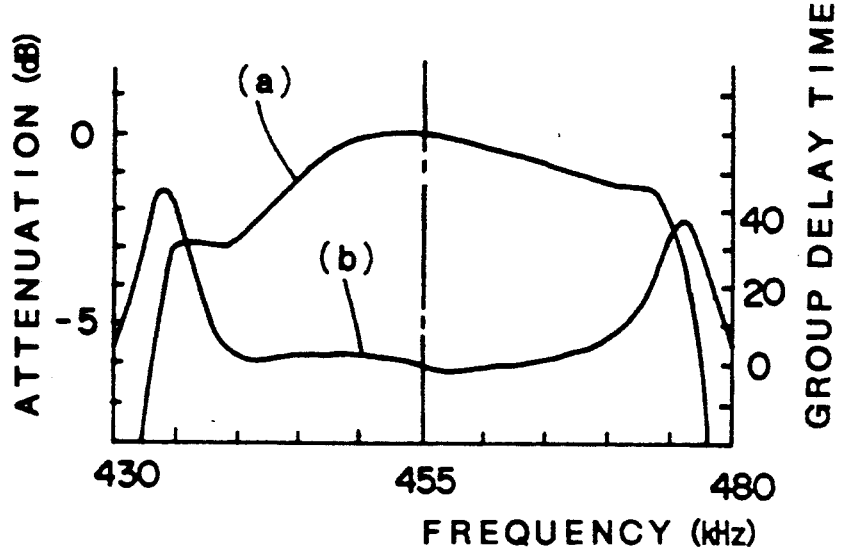
FIG. 7 is a graph similar to that of FIG. 6 but showing those of Sample 2.
Figure 8:
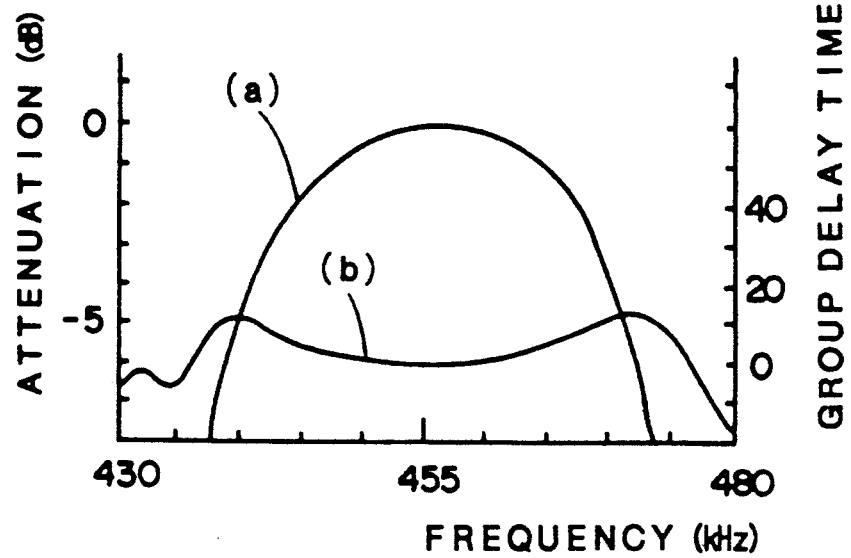
FIG. 8 is a graph similar to that of FIG. 6 but showing those of Sample 3.
Figure 9:
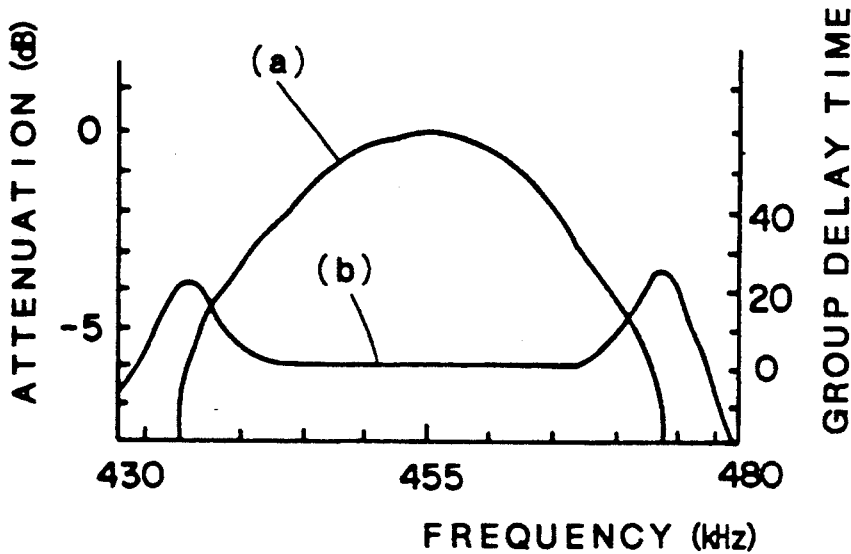
FIG. 9 is a graph similar to that of FIG. 6 but showing those of Sample 4 which is prepared in accordance with the present invention.

FIGS. 6 through 9 show the amplitude characteristics (a) and the group delay time characteristics (b) of these samples, respectively.

As shown in FIG. 5, the group delay time (b) for the center frequency of 12 kHz is 10 μsec, 4 μsec, 10 μsec and 2 μsec for Samples 1 through 4 respectively. It will be appreciated that the embodiment of the present invention, or Sample 4, presents a remarkable improvement in terms of group delay time as compared with Samples 1 and 2, representing two different conventional ladder-type electric filters and Sample 3 prepared for the purpose of comparison. From these data, it may be understood that the group delay time of the ladder-type electric filter can be improved by arranging a pair of series-resonators S1 and S2 having different capacitance values in such a manner that one S2 having a greater capacitance is disposed subsequently to the other S1 having a smaller capacitance. Such ladder-type electric filter is particularly suited for digital modulation type mobile radio communication station.

The above description has merely referred to an example of a filter device consisting of two basic filter units, each comprising two series-resonators and two parallel-resonators. However, the present invention may be applied to any filter device in which any number of filter units are provided.

As illustrated and described above, in the ladder-type electric filter device according to the present invention, the improved group delay time characteristic can be obtained simply by arranging a pair of series-resonators having different capacitance values in such a manner that one having a greater capacitance is disposed subsequently to one having a smaller capacitance. Therefore, the present invention has advantages that the ladder-type electric filter device can be manufactured almost without any additional cost and can be suitably used as a high quality filter for a digital modulation type mobile radio communication station such as an automobile telephone set or a portable telephone set.

It is to be understood that the present invention in not restricted to the particular embodiment illustrated and that numerous modifications and alternations may be made by those skilled in the art without departing from the spirit and scope of the invention.

I claim:

1. A ladder-type electric filter comprising an input terminal, an output terminal and a plurality of resonator units connected between said input terminal and said output terminal, each resonator unit including a series-resonator and a parallel-resonator which are L connected, the series-resonators of said resonator units connected in series between said input terminal and said output terminal having capacitance values which increase in magnitude from the series-resonator of one of said plurality of resonator units arranged closest to said input terminal to the series-resonator of further one of said plurality of resonator units arranged closest to said output terminal.

2. A ladder-type electric filter as claimed in claim 1, wherein the parallel-resonator in each resonator unit has a capacitance larger than that of the associated series-resonator of the same resonator unit.

3. A ladder-type electric filter as claimed in claim 1, wherein two series-resonators are connected in series between said input and output terminals and two parallel-resonators are connected in parallel between said input and output terminals, a first series-resonator of said two series-resonators being connected to said output terminal and a second series-resonator of said two series-resonators being connected to said input terminal and said first series-resonator having a capacitance larger than that of said second series-resonator.

4. A ladder-type electric filter comprising an input terminal, an output terminal and at least two resonator units connected between the input terminal and the output terminal, each resonator unit comprising a series-resonator and a parallel-resonator which are L connected, the series-resonator of one of said resonator units arranged closest to the output terminal having a capacitance larger than that of the series-resonator of another one of said resonator units arranged closest to the input terminal.

5. A ladder-type electric filter as claimed in claim 4, wherein the parallel-resonator in each of said resonator units has a capacitance larger than that of the associated series-resonator of the same resonator unit.

* * * * *